(12) United States Patent
Gatta et al.

(10) Patent No.: US 7,573,322 B2
(45) Date of Patent: *Aug. 11, 2009

(54) LINE REGULATOR WITH HIGH BANDWIDTH (BW) AND HIGH POWER SUPPLY REJECTION RATIO (PSRR) AND WIDE RANGE OF OUTPUT CURRENT

(75) Inventors: Francesco Gatta, Laguna Niguel, CA (US); Karapet Khanoyan, Lake Forest, CA (US)

(73) Assignee: Broadcom Corporation, Irvine, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 11/740,648

(22) Filed: Apr. 26, 2007

(65) Prior Publication Data

US 2007/0194812 A1    Aug. 23, 2007

Related U.S. Application Data

(63) Continuation of application No. 11/078,893, filed on Mar. 11, 2005, now Pat. No. 7,212,043.

(51) Int. Cl.
*G05F 1/10* (2006.01)
(52) U.S. Cl. .............. 327/538; 327/540; 327/541; 327/68; 327/72
(58) Field of Classification Search ............. None
See application file for complete search history.

(56) References Cited

U.S. PATENT DOCUMENTS

| | | | |
|---|---|---|---|
| 4,779,037 A | 10/1988 | LoCascio | |
| 5,712,511 A | 1/1998 | Chan et al. | |
| 5,796,276 A * | 8/1998 | Phillips et al. | 327/108 |
| 6,114,843 A * | 9/2000 | Olah | 323/280 |
| 6,340,918 B2 | 1/2002 | Taylor | |
| 6,492,864 B2 | 12/2002 | Mahrla | |
| 6,522,110 B1 * | 2/2003 | Ivanov | 323/267 |
| 6,614,706 B2 | 9/2003 | Feurle | |
| 6,680,837 B1 | 1/2004 | Buxton | |
| 7,102,395 B2 | 9/2006 | Saito | |
| 7,119,521 B2 * | 10/2006 | Ishii et al. | 323/222 |
| 7,212,043 B2 * | 5/2007 | Gatta et al. | 327/77 |

* cited by examiner

*Primary Examiner*—An T Luu
(74) *Attorney, Agent, or Firm*—McAndrews, Held & Malloy

(57) ABSTRACT

Aspects of a method and system for a linear regulator with high bandwidth, PSRR, and a wide range of output current are provided. A method for isolating voltages in a circuit may comprise applying a reference voltage to an isolation resistor based on a supply voltage. An internal voltage at a reference point may be determined based on the applied reference voltage, and a maximum and/or minimum voltage may be determined based on the internal voltage. A plurality of output transistor devices may be controlled based on either the maximum voltage or minimum voltage. The reference voltage may be modified based on controlling the plurality of output transistor devices. By turning ON and OFF the output transistor devices, a much wider operating range is facilitated.

23 Claims, 6 Drawing Sheets

LINE REGULATOR WITH HIGH BANDWIDTH (BW) AND HIGH POWER SUPPLY REJECTION RATIO (PSRR) AND WIDE RANGE OF OUTPUT CURRENT

CROSS-REFERENCE TO RELATED APPLICATIONS/INCORPORATION BY REFERENCE

This application is a continuation of U.S. application Ser. No. 11/078,893 filed Mar. 11, 2005, now U.S. Pat. No. 7,212,043.

FIELD OF THE INVENTION

Certain embodiments of the invention relate to analog circuit design. More specifically, certain embodiments of the invention relate to a method and system for a line regulator with high bandwidth (BW) and high power supply rejection ratio (PSRR) over a wide range of output current.

BACKGROUND OF THE INVENTION

A feedback system designed to hold the value of its output constant independent of disturbances may be known as a regulator. In some conventional electronic circuits, linear regulators may be utilized for isolating voltages in a circuit. In these electronic circuits, power for operating the circuits may be supplied by a voltage source and a ground reference. There may be jitter or noise in the voltage source, which causes the voltage level supplied by the power supply to operating circuits to vary.

Jitter is time-based error resulting from abrupt and unwanted variations of one or more signal characteristics, such as the interval between successive pulses, amplitude of successive cycles, frequency of successive cycles and phase of successive cycles. Jitter may result from varying time delays in the circuit paths between components in a path in which a signal traverses. Jitter is generally characterized in qualitative terms such as amplitude, phase, pulse width and pulse duration, and/or in quantitative terms such as average, RMS or peak-to-peak.

Noise that occurs in a ground reference may also cause the voltage level of a voltage supply to vary. A linear regulator may be utilized in applications where it is important that the voltage applied to a circuit block be maintained at a constant voltage level with a minimum of variation in that constant voltage. Although some circuits may be utilized to limit unwanted variations in voltage levels, these circuits are applicable for use at a specific frequency.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention provide a method and system for a linear regulator with high bandwidth (BW) and high power supply rejection ratio (PSRR) over a wide range of output current, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a linear regulator with high bandwidth and high power supply rejection ratio (PSRR) and a wide range of output current. In one embodiment of the invention, the internal voltage supply of the operating circuits may be isolated from variations in the voltage level of a global supply voltage, and from noise in a ground reference, or ground noise. These operating circuits may maintain a constant internal supply voltage in spite of variations in the global supply voltage. This characteristic may be measured quantitatively as a PSRR. Various embodiments of the invention may provide high PSRR at high frequencies to circuits operating with a wide range of current consumption by utilizing current sources that vary the output current level within the required range.

Figure 1A:
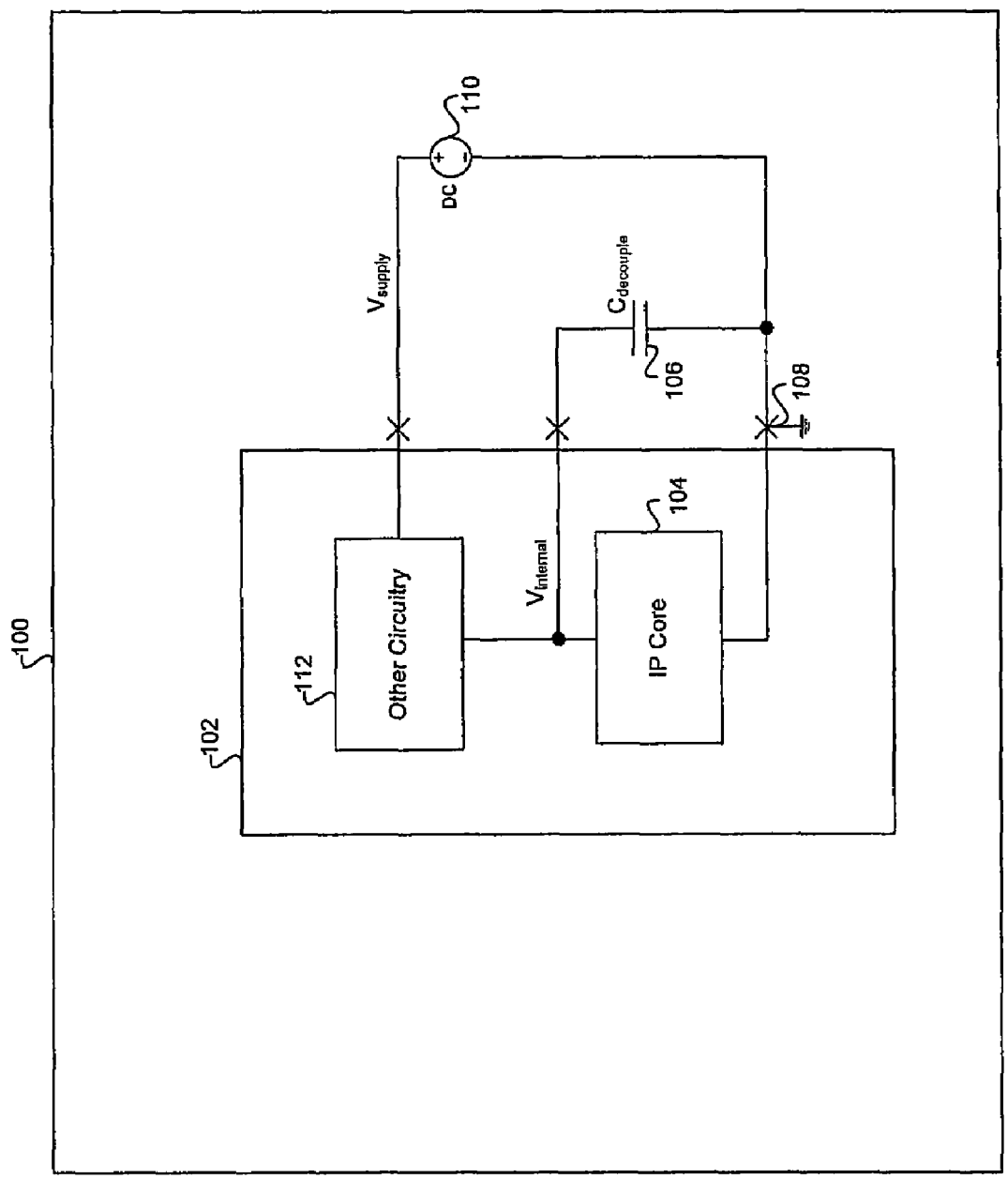
FIG. 1a is a block diagram of an exemplary system for a linear regulator with external capacitor.

FIG. 1a is a block diagram of an exemplary system for a linear regulator with external capacitor, in accordance with an embodiment of the invention. With reference to FIG. 1a, there is shown a circuit board 100. The circuit board 100 may comprise an integrated circuit device (IC) 102, a voltage source 110, a ground reference 108, and a decoupling capacitor ($C_{decouple}$) 106. Also shown in FIG. 1a are a global supply voltage $V_{supply}$, and an internal supply voltage, $V_{internal}$. The IC 102 may comprise intellectual property (IP) core circuitry 104, and other circuitry 112. An integrated circuit device may alternatively be referred to as an integrated circuit, IC, IC device, IC chip, or chip. The ground reference may alternatively be referred to as ground. The circuit board may alternatively be referred to as a board.

In operation, the voltage level of the global supply voltage, $V_{supply}$, may be coupled to the IC 102 on the board 100 via an external pin on IC 102. Consequently, variations in the voltage level of the voltage source 110 on the circuit board 100 may produce variations in the voltage level of the global supply voltage, $V_{supply}$, which may, via the other circuitry block 112, result in variations in the voltage level of the internal supply voltage, $V_{internal}$. This may, in turn, result in variations in the voltage applied to the IP core circuitry 104.

In some conventional linear regulator designs, the decoupling capacitor $C_{decouple}$ 106 may be externally coupled to the IC 102 on the circuit board 100. The decoupling capacitor $C_{decouple}$ 106 may couple to the internal supply voltage, $V_{internal}$ via an external pin on the IC 102. The decoupling capacitor $C_{decouple}$ 106, and the IC 102 may each also couple to the ground 108 on the board 100. The coupling of the decoupling capacitor $C_{decouple}$ 106 to the IC 102 may provide isolation between the internal supply voltage, $V_{internal}$ and the global supply voltage, $V_{supply}$, based on the frequency dependent transconductance, $g_c(s)$, of the decoupling capacitor $C_{decouple}$ 106 which may be expressed as:

$$g_c(s) = C_{decouple} \times s \quad \text{equation[1]}$$

where s may represent the frequency of a signal applied to the decoupling capacitor $C_{decouple}$ 106. For low frequencies, or small values of, s, the frequency of the signal applied to the capacitor, the frequency dependent transconductance $g_c(s)$ may represent a low conductance. For extremely low frequencies, the decoupling capacitor $C_{decouple}$ 106 may approximate a nonconductor, or an open circuit. For high frequencies the decoupling capacitor $C_{decouple}$ 106 may be highly conductive. For extremely high frequencies, the decoupling capacitor $C_{decouple}$ 106 may approximate a short circuit. The behavior of the decoupling capacitor $C_{decouple}$ 106 may be such that Cdecouple 106 may approximate a short circuit for unwanted signals present on the board ground 108. This may result in voltage levels from the unwanted signals being couple to the internal supply voltage, $V_{internal}$, and to the IP core circuitry 104.

The coupling of an external decoupling capacitor $C_{decouple}$ 106 may be implemented via bonding of pins of IC 102 and the decoupling capacitor $C_{decouple}$ 106 to pads on the board 100. The pads, and interconnections between pads on the board 100 may collect external noise on the board 100 that may couple to the internal supply voltage, $V_{internal}$. The pads and interconnections on the board 100 may also produce parasitic effect that comprise parasitic resistor and inductor values which may further compromise the ability of the external the decoupling capacitor $C_{decouple}$ 106 to provide isolation between the internal supply voltage $V_{internal}$ and the global supply voltage $V_{supply}$. Another shortcoming may be that the decoupling capacitor $C_{decouple}$ 106 may comprise a large capacitor that takes up expensive area on the board 100 and requires that an external pin on the IC 102 be utilized for coupling to $C_{decouple}$ 106.

Figure 1B:
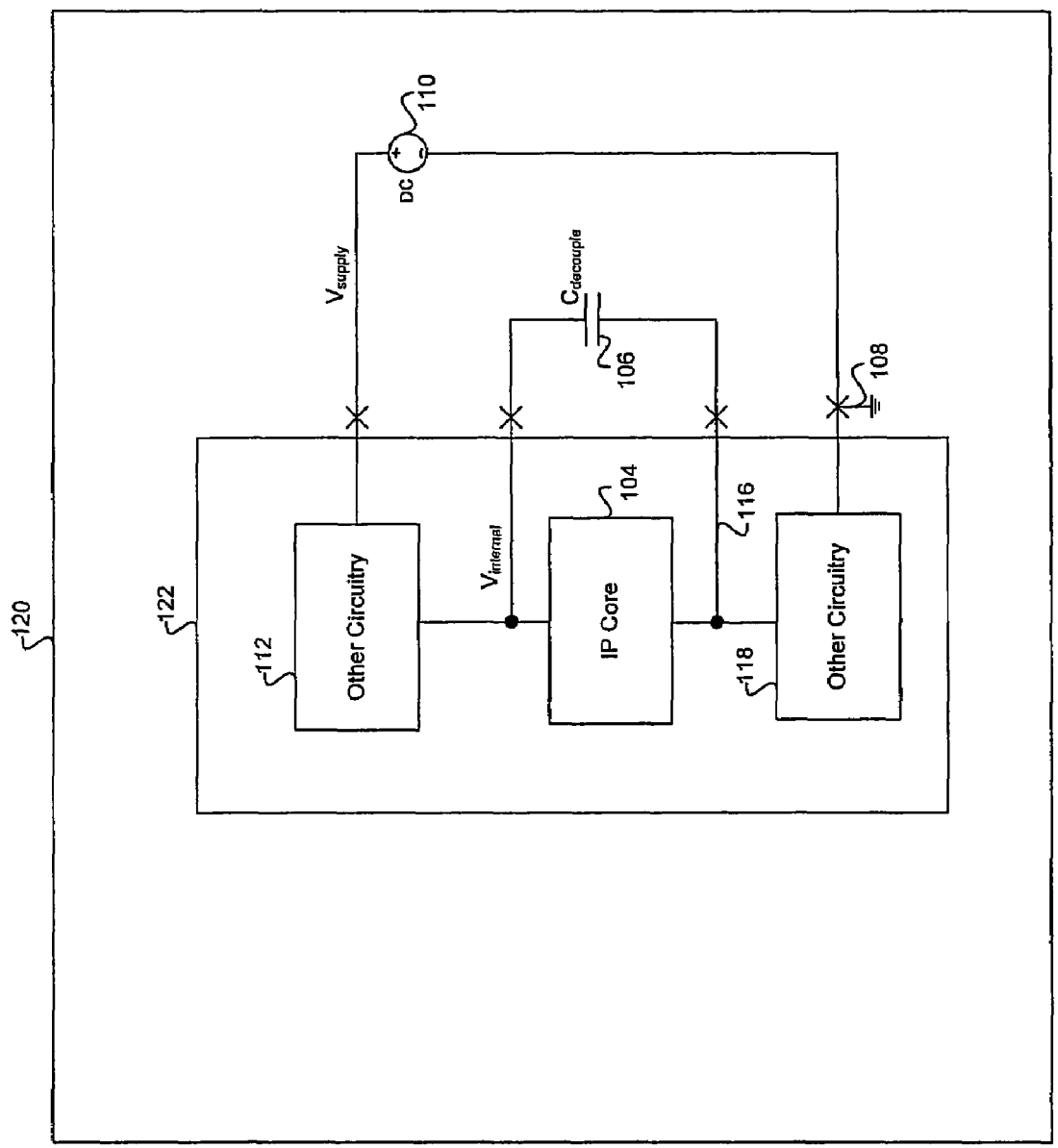
FIG. 1b is a block diagram of an exemplary system for a linear regulator with floating external capacitor.

FIG. 1b is a block diagram of an exemplary system for a linear regulator with floating external capacitor, in accordance with an embodiment of the invention. With reference to FIG. 1b, there is shown a circuit board 120. The circuit board 120 may comprise an IC 122, a voltage source 110, a ground reference 108, and the decoupling capacitor $C_{decouple}$ 106. Also shown in FIG. 1b are voltages $V_{supply}$ and $V_{internal}$. The IC 102 may comprise IP core circuitry 104, and other circuitry blocks 112, and 118.

In operation, when compared to the board 100, the board 120 may utilize a floating decoupling capacitor $C_{decouple}$ 106. The floating decoupling capacitor $C_{decouple}$ 106 may not couple ground noise to the internal voltage $V_{internal}$ as in board 100, but the circuit design for board 120 may still suffer other shortcomings of board 100. The coupling of an external decoupling capacitor $C_{decouple}$ 106 may be implemented via bonding of pins of IC 122 and the decoupling capacitor $C_{decouple}$ 106 to pads on the board 120. The pads, and interconnections between pads on the board 120 may collect external noise on the board 120 that may couple to the internal supply voltage, $V_{internal}$. The pads and interconnections on the board 120 may also produce parasitic effect that comprise parasitic resistor and inductor values which may further compromise the ability of the external the decoupling capacitor $C_{decouple}$ 106 to provide isolation between the internal supply voltage $V_{internal}$ and the global supply voltage $V_{supply}$. In addition, the design for board 120 may require the utilization of 2 pins in IC 122 for coupling to the decoupling capacitor $C_{decouple}$ 106.

Figure 2:
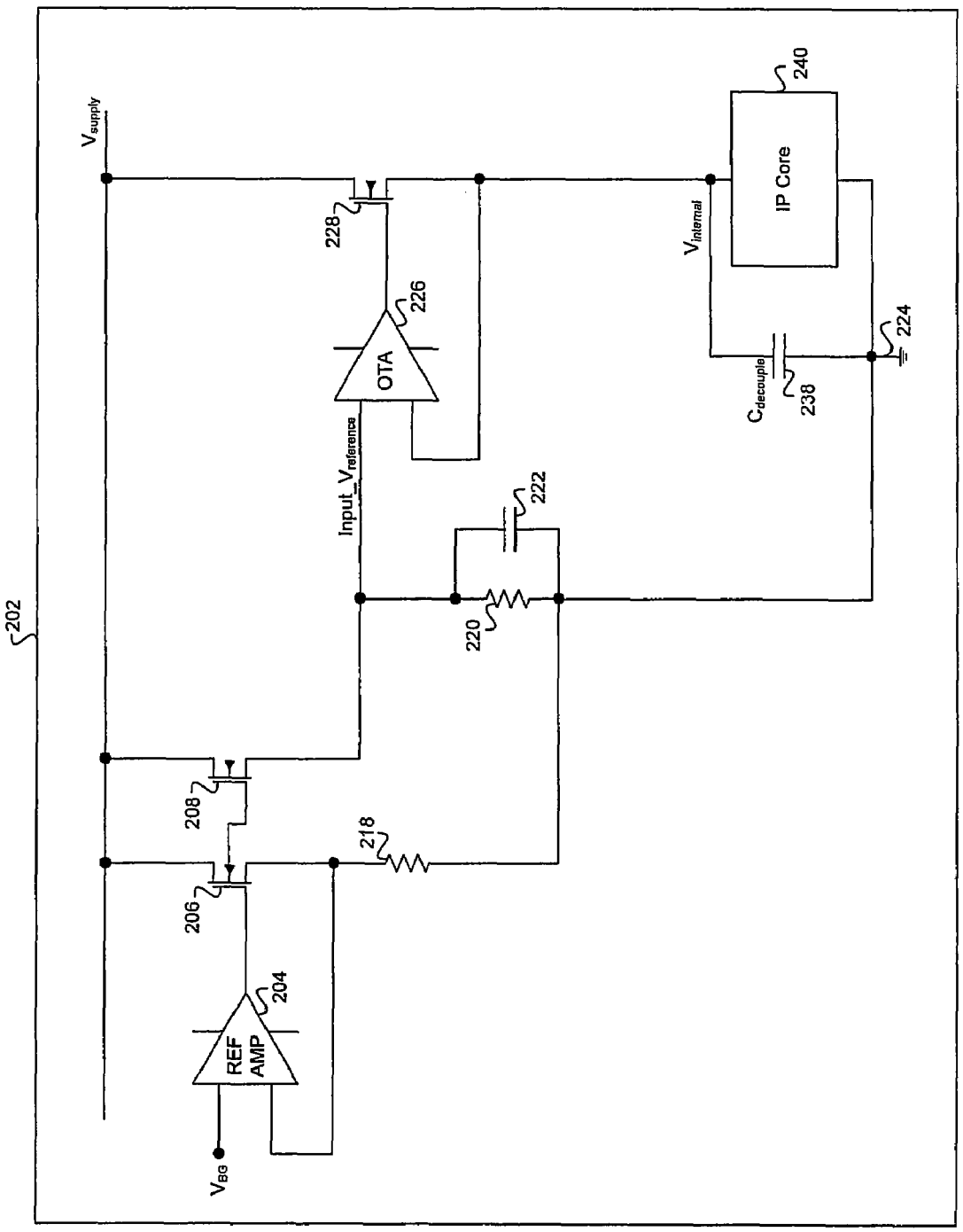
FIG. 2 is a block diagram of an exemplary system for a linear regulator with internal capacitor and reference voltage, in accordance with an embodiment of the invention.

FIG. 2 is a block diagram of an exemplary system for a linear regulator with internal capacitor and reference voltage, in accordance with an embodiment of the invention. With reference to FIG. 2, there is shown an IC 202. The IC 202 may comprise a reference amplifier 204, a plurality of reference transistor devices 206, and 208, a plurality of resistors 218 and 220, a capacitor 222, a decoupling capacitor $C_{decouple}$ 238, an operational transconductance amplifier (OTA) 226, an output transistor device 228, an IP core 240, and a ground reference 224. Also shown in FIG. 2 are the global supply voltage $V_{supply}$, the input reference voltage Input_$V_{reference}$, and the internal supply voltage, $V_{internal}$. An OTA 226 or a reference amplifier 204 may also be known as an amplifier. An output transistor device may also be known as an output transistor. A reference transistor device may also be known as a reference transistor. A reference transistor or an output transistor may also be referred to as a transistor. The OTA 226, and output transistor 228 may comprise output stage circuitry. The decoupling capacitor 238 may be internal to the IC 202.

Reference transistors 206, 208, and output transistor 228 may utilize metal oxide semiconductor field effect transistors (MOSFET) technology. In various embodiments of the invention, transistors 206, 208, and 228 may not be limited to MOSFET technology. The output from amplifier 204 may be coupled to the gate terminal, or gate, of reference transistor 206. The drain terminal, or drain, of reference transistor 206 may be coupled to an input of amplifier 204. Also coupled to an input of amplifier 204 may be a bandgap voltage $V_{BG}$.

The output from amplifier 204 may also be coupled to the gate of reference transistor 208. The source terminal, or source, of reference transistor 208 may be coupled to the global supply voltage, $V_{supply}$. The drain of reference transistor 208 may be coupled to resistor 220, capacitor 222, and to the operational transconductance amplifier (OTA) 226. The resistor 220 may also be coupled to ground 224. The capacitor 222 may also be coupled to ground 224.

An input reference voltage Input_$V_{reference}$ may be coupled to an input of the OTA 226. An internal supply voltage $V_{internal}$ may also be supplied to an input of OTA 226. The output of OTA 226 may be coupled to the gate of output transistor 228. The source and the drain of the output transistor 228 may be coupled to the global supply voltage $V_{supply}$ and to the internal supply voltage $V_{internal}$ respectively. $V_{internal}$ may be coupled to the IP core 240. The IP core 240 may also be coupled to the ground reference 224. The decoupling capacitor $C_{decouple}$ 238 may be coupled to the internal supply voltage $V_{internal}$ and to the ground reference 224.

In operation, the amplifier 204 may produce an output voltage level, $v_{out}$, that is proportional to the difference between the voltage levels of the inputs:

$$v_{out} = A_{204} \times (V_{BG} - V_{dr206}), \text{ where} \quad \text{equation[2]}$$

the variable $A_{204}$ may represent the open loop gain of the amplifier, and $v_{dr206}$ may represent the voltage at the drain of the reference transistor 206. The output voltage, $v_{out}$, may be coupled to the gate of transistors 206 and 208.

The bandgap voltage $V_{BG}$ may be supplied by circuitry adapted to generating a bandgap reference voltage. A bandgap reference voltage may be characterized by a voltage level that may remain constant with less variation due to changes in device operating temperature than may be observed in other voltage source circuit designs.

The transistors 206, 208, and 228 may be utilized as current source devices, or current sources, for which the drain current, $i_d$, may be proportional to the transconductance of the transistor, $g_m$, and the incremental gate to source voltage, $v_{gs}$, applied to the transistor:

$$i_d = g_m \times v_{gs} \qquad \text{equation[3]}$$

From FIG. 2 it may be seen that:

$$v_{dr206} \cong i_{dr206} r_{218} \qquad \text{equation[4]}$$

and that:

$$v_{gs206} \cong A_{204}(V_{BG} - i_{dr206} r_{218}) - V_{supply} \qquad \text{equation[5]}$$

where $r_{218}$ may represent the resistive value of resistor 218, $i_{d206}$ may represent the drain current at transistor 206, and $v_{gs206}$ may represent the gate to source voltage of transistor 206.

From equations [2], [3], [4], and [5] it may be determined that:

$$v_{out} \cong \frac{A_{204}(V_{BG} + g_{m206} r_{218} V_{supply})}{1 + A_{204} g_{m206} r_{218}} \qquad \text{equation [6]}$$

where $g_{m206}$ may represent the transconductance of the transistor 206.

The transconductance value of $g_{m206}$ of transistor 206 may vary based on a plurality of factors such as, for example, manufacturing variations during the fabrication of the transistor, or due to variations in the operating temperature of the transistor. From equation[3] it may be seen that a variation in the value of $g_m$ may produce a change in the drain current, $i_d$. From equation[4] it may be seen that a variation in the drain current of the transistor 206 $i_{dr206}$ may produce a change in the drain voltage of transistor 206 $v_{dr206}$. From equation[2] it may be seen that a variation in the drain voltage $v_{dr206}$ may produce a change in the output voltage from the amplifier 204, $v_{out}$. For example, an increase in the operating temperature may reduce the value $g_{m206}$ for transistor 206. This may result in an increase in the drain voltage $v_{dr206}$ and a decrease in the output voltage $v_{out}$. The decrease in the output voltage $v_{out}$ may increase the gate-source voltage $V_{gs206}$ at the transistor 206, increasing the drain current $i_{dr206}$, which in turn may increase the drain voltage $v_{dr206}$. In one aspect, the amplifier 204 may control the drain voltage $v_{dr206}$, which may control the output voltage $v_{out}$. From equation[8], it may be seen that the output voltage $v_{out}$ may be proportional to the bandgap voltage, $V_{BG}$ and to the global supply voltage, $V_{supply}$.

In operation, the gate voltage at transistor 208 may be equal to the output voltage, $v_{out}$. The drain current for reference transistor 208 may be represented as:

$$i_{dr208} = g_{m208} v_{GS208} \qquad \text{equation[7]}$$

where, $i_{dr208}$ may represent the drain current of the transistor 208, $g_{m208}$ may represent the transconductance of the transistor 208, and $v_{gs208}$ may represent the gate to source voltage of the transistor 208.

Furthermore, from FIG. 2 it may be seen that:

$$v_{gs208} = v_{out} - V_{supply} \qquad \text{equation[8]}$$

and, from equation[6] that:

$$v_{gs208} \cong \frac{A_{204} V_{BG} - V_{supply}}{1 + A_{204} g_{m206} r_{218}} \qquad \text{equation [9]}$$

The input reference voltage, Input_$V_{reference}$, may be expressed:

$$\text{Input\_V}_{reference} = i_{dr208} \frac{r_{220}}{r_{220} C_{222} s + 1} \qquad \text{equation [10]}$$

where s may represent the frequency of the signal Input_$V_{reference}$, $r_{220}$ may represent the resistive value of the resistor 220, and $C_{222}$ may represent the capacitance value of the capacitor 222.

From equations [7], [9], and [10] the input reference voltage, Input_$V_{reference}$, may be expressed:

$$\text{Input\_V}_{reference} \cong g_{m208}\left(\frac{A_{204} V_{BG} - V_{supply}}{1 + A_{204} g_{m206} r_{218}}\right)\left(\frac{r_{220}}{r_{220} C_{222} s + 1}\right) \qquad \text{equation [10a]}$$

for large values of $A_{204}$, for $g_{m206}$ approximately equal to $g_{m208}$, and for low values of s, the following relationship between the input reference voltage, Input_$V_{reference}$, and the bandgap reference voltage, $V_{BG}$, may be expressed:

$$\text{Input\_V}_{reference} \cong \frac{V_{BG}}{r_{218}} \cdot r_{220} \qquad \text{equation [11]}$$

One aspect of equation[11] is that the value of the input reference voltage, Input_$V_{reference}$, may be constant independently from variations due to $g_m$ in reference transistor 208, as long as the transistors 206 and 208 are in saturation mode. As may also be seen in equation[11], Input_$V_{reference}$ may be proportional to $V_{BG}$.

The resistor 220 and capacitor 222 may implement a low pass filter. The low pass filter may prevent high frequency noise or jitter in Input_$V_{reference}$, which may be introduced by supply voltage $V_{supply}$, or the ground reference 224. The expression:

$$t_{LPF} = r_{220} c_{220} \qquad \text{equation[12]}$$

may define a time constant that establishes an upper frequency bound in the pass band, $f_{PB}$ of the low pass filter:

$$f_{PB} = \frac{1}{2\pi t_{LPF}} \qquad \text{equation [13]}$$

wherein components of noise or jitter in Input_$V_{reference}$ that are at frequencies greater than $f_{PB}$ may be attenuated relative to noise or jitter in Input_$V_{reference}$ that are at frequencies lower than $f_{PB}$.

Based on equation[10a], a transfer function may be defined that represents the relationship between the input reference voltage, Input_$V_{reference}$, and the global supply voltage, $V_{supply}$:

$$\frac{\text{Input\_V}_{reference}}{V_{supply}} \cong -\left(\frac{g_{m208}}{1 + A_{204}(s)g_{m206}r_{218}}\right)\left(\frac{r_{220}}{r_{220}C_{222}s + 1}\right) \quad \text{equation [14]}$$

where $A_{204}(s)$ may represent the open loop gain of the amplifier 204 as a function of the frequency, s.

The equation[14] may express the degree of coupling between the input reference voltage Input\_$V_{reference}$, and the global supply voltage, $V_{supply}$. The equation[14] may express the amount of change in Input\_$V_{reference}$ that may be induced by a given change in $V_{supply}$. As shown in equation[14], the amount of induced change in Input\_$V_{reference}$ from a change in $V_{supply}$ may vary as a function of frequency, s.

The amplifier operational transconductance amplifier, OTA 226, may couple a voltage, $v_{g228}$, to the gate of the transistor 228, which is proportional to the voltage difference between the input voltages at the OTA 226:

$$v_{g228} = A_{OTA}(\text{Input\_}V_{reference} - V_{internal}) \quad \text{equation[15]}$$

where, $A_{OTA}$ may represent the value of the open loop voltage gain of the OTA 226.

With reference to FIG. 2, the drain current, $i_{dr228}$, at the transistor 228 may be represented as:

$$i_{dr228} = g_{m228} [A_{OTA}(\text{Input\_}V_{reference} - V_{internal}) - V_{supply}] \quad \text{equation[16]}$$

and the internal supply voltage, $V_{internal}$, may be represented as:

$$V_{internal} \cong i_{dr228} \frac{Z_{IP}}{Z_{IP}C_{decouple}s + 1} \quad \text{equation [17]}$$

where $Z_{IP}$ may represent the impedance of the IP core 240, and $C_{decouple}$ may represent the capacitance of the decoupling capacitor $C_{decouple}$ 238. From equations [16], and [17], $V_{internal}$ may be represented as:

$$V_{internal} \cong g_{m228}\left(\frac{A_{OTA}V_{\text{Input\_reference}} - V_{supply}}{1 + g_{m228}A_{OTA}Z_{IP}/(Z_{IP}C_{decouple}s + 1)}\right) \quad \text{equation [18]}$$

$$\frac{Z_{IP}}{Z_{IP}C_{decouple}s + 1}$$

where, for a large value of open loop gain, $A_{OTA}$, in the OTA 226, and for low values of s:

$$V_{internal} \cong V_{\text{Input\_reference}} \quad \text{equation[19]}$$

Equation[19] indicates that for large values of open loop gain, $A_{OTA}$, in the OTA 226, the internal supply voltage, $V_{internal}$, may be regulated and the value held constant independent of disturbances. In particular, large values of AOTA may comprise values that may be greater than the value of the transconductance of transistor 228, $g_{m228}$, multiplied by the value of the impedance of the IP core 240, $Z_{IP}$, when s is small. Examples of disturbances may comprise, for example, noise or jitter introduced by the global supply voltage, $V_{supply}$, variations or variations in the value of the transconductance, $g_{m228}$, of the transistor 228.

Based on equation[18], a transfer function may be defined that represents the relationship between the internal supply voltage, $V_{internal}$, and the global supply voltage, $V_{supply}$:

$$\frac{V_{internal}}{V_{supply}} \cong -\left(\frac{g_{m228}}{1 + g_{m228}A_{OTA}(s)Z_{IP}/(Z_{IP}C_{decouple}s + 1)}\right) \quad \text{equation [20]}$$

$$\frac{Z_{IP}}{Z_{IP}C_{decouple}s + 1}$$

where $A_{OTA}(s)$ may represent the open loop gain of the amplifier OTA 226 as a function of the frequency, s.

The equation[20] may express the degree of coupling between the internal supply voltage $V_{internal}$, and the global supply voltage, $V_{supply}$. The equation[20] may express the amount of change in $V_{internal}$ that may be induced by a given change in $V_{supply}$. As shown in equation[20], the amount of induced change in $V_{internal}$ from a change in $V_{supply}$ may vary as a function of frequency, s.

The decoupling capacitor $C_{decouple}$ 238 may be configured to isolate the internal supply voltage $V_{internal}$ from noise or jitter that may be introduced by the ground reference 224. The decoupling capacitor, $C_{decouple}$, 238 may represent a large conductance at high frequencies. As a result, unwanted high frequency signals, such as, for example, noise or jitter, which may be introduced at the ground reference 224 may be shorted to $V_{internal}$, with none of the voltage from the unwanted signal being applied to the IP core 240. As a result of the decoupling capacitor $C_{decouple}$ 238, the voltage level at to the IP core 240, between $V_{internal}$, and ground 224, may be held constant, independent of noise or jitter in the ground 224.

The stability of the loop comprising the OTA 226, the output transistor 228, the IP core 240, and the decoupling capacitor $C_{decouple}$ 238 may be obtained via a dominant pole that may be created based on the value of the transconductance of the output transistor 228, $g_{m228}$, and the value of the capacitance of the decoupling capacitor, $C_{decouple}$ 238. Since the capacitance value of $C_{decouple}$ 238 may be large, the loop time constant may also be large. As a result, the loop comprising the OTA 226, transistor 228, IP core 240, and $C_{decouple}$ 238, may implement a low pass filter that filters high frequency signals. Consequently, the loop may evidence a slow response to high frequency noise or.

The value of the open loop gain of the operational transconductance amplifier, $A_{OTA}$, may vary as a function of the frequency, s, as:

$$A_{OTA}(s) = \frac{A_{OTA}}{1 + s/s_0} \quad \text{equation [21]}$$

where $s_0$ may represent the 3 dB bandwidth of the OTA 226. As the frequency, s, increases above $s_0$, the open loop gain of the OTA 226 may decrease. When the value of the open loop gain becomes small, and is no longer greater than $g_{m228}$ times $Z_{IP}/(Z_{IP}*C_{decouple}*s+1)$, as seen in equation[20], the internal supply voltage $V_{internal}$ becomes dependent on the transconductance of the output transistor 228, $g_{m228}$. Furthermore, the value of the transfer function in equation[20] may increase, indicating that a change in the value of the global supply voltage, $V_{supply}$, due to, for example, noise or jitter, may induce a larger change in the value of the internal supply voltage, $V_{internal}$. Consequently, the value of the internal supply voltage, $V_{internal}$, may be less tightly regulated, thereby reducing the value of the PSRR.

A potential shortcoming in the design of IC 202 may be that the ability to isolate the internal supply voltage $V_{internal}$ from sources of noise or jitter may depend upon the open loop gain, $A_{OTA}$ of the OTA 226. For high values of the gain $A_{OTA}$, a small change in the internal supply voltage $V_{internal}$ relative to the input reference voltage Input_$V_{reference}$ may produce a large drain current, $i_{dr228}$, at the transistor 228. The large amount of current produced by the OTA 226 may rapidly induce a correction in the output transistor 228 via the gate voltage $v_{gs228}$ to correct for the small change in the internal supply voltage $V_{internal}$ that may return the internal supply voltage $V_{internal}$ to its original value prior to the small change in $V_{internal}$. In this case, the internal supply voltage $V_{internal}$ may be described as being tightly regulated and with a high PSRR. However, for low value of open loop gain $A_{OTA}$, a larger change in the internal supply voltage $V_{internal}$ relative to the input reference voltage Input_$V_{reference}$ may occur before a large enough current $i_{dr228}$ may be produced to induce a correction in the output transistor 228. In this case, the internal voltage supply $V_{internal}$ may be less tightly regulated and with a lower PSRR. The open loop gain of the OTA 226 may vary according to the frequency of the signal applied to the inputs of the OTA as shown in equation[21]. The open loop gain, $A_{OTA}$, may be lower for signals at higher frequencies. In this aspect, one limitation of the design in IC 202 is that it may provide linear regulation and a high PSRR but over a limited BW.

Figure 3:
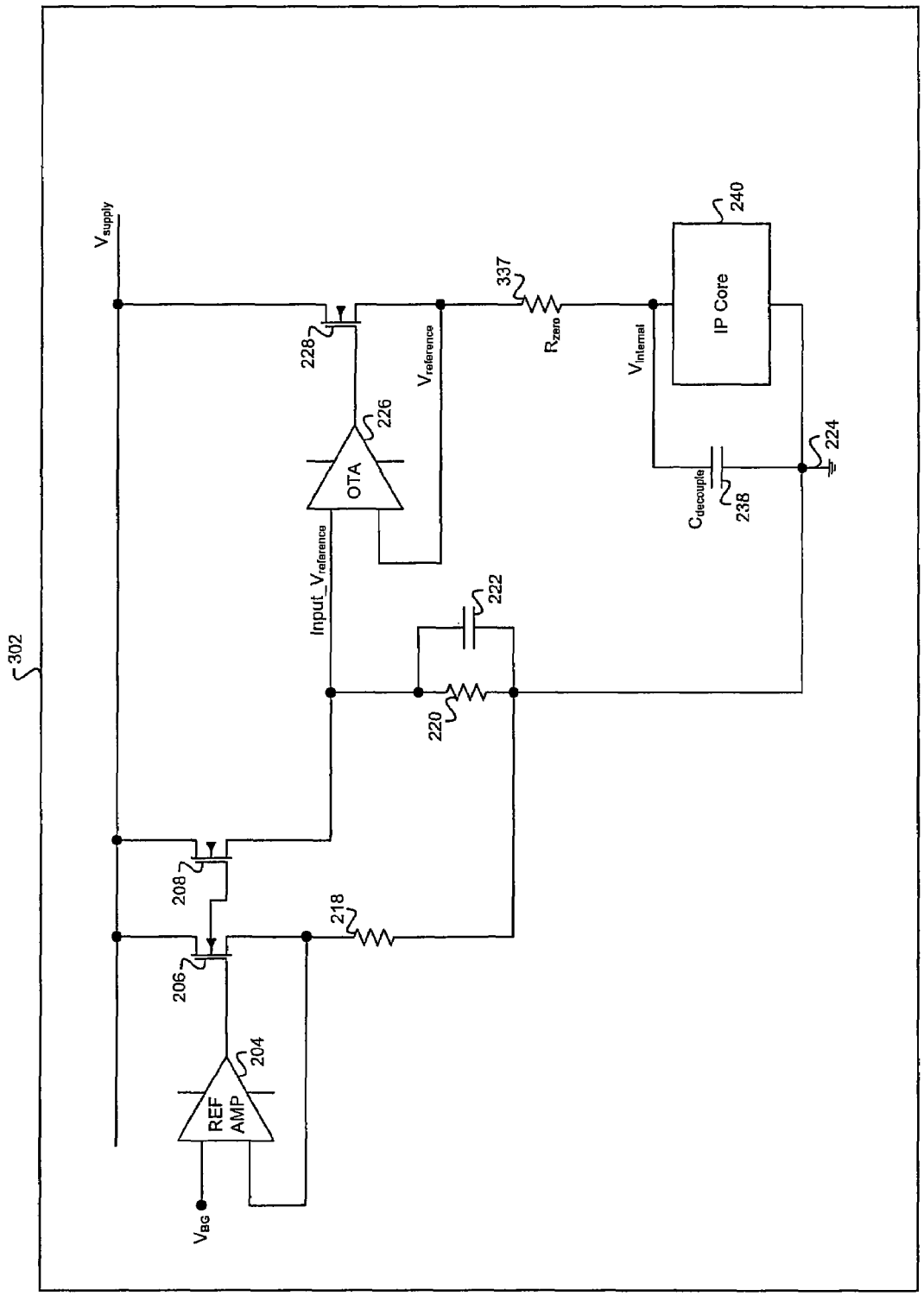
FIG. 3 is a block diagram of an exemplary system for a linear regulator with internal capacitor, reference voltage, and internal resistor, in accordance with an embodiment of the invention.

FIG. 3 is a block diagram of an exemplary system for a linear regulator with internal capacitor, reference voltage, and internal resistor, in accordance with an embodiment of the invention. With reference to FIG. 3, there is shown an IC 302. The IC 302 may comprise a reference amplifier 204, a plurality of reference transistor devices 206, and 208, a plurality of resistors 218 and 220, a capacitor 222, an on-chip decoupling capacitor $C_{decouple}$ 238, an operational transconductance amplifier (OTA) 226, an output transistor device 228, an isolation resistor, $R_{zero}$ 337, an IP core 240, and a ground reference 224. Also shown in FIG. 3 are voltages $V_{supply}$, Input_$V_{reference}$, $V_{reference}$, and $V_{internal}$. The OTA 226, and output transistor 228 may comprise output stage circuitry.

With reference to FIG. 3, the internal supply voltage, $V_{internal}$, may be represented as:

$$V_{internal} \cong i_{dr228} \frac{R_{zero}(Z_{IP}C_{decouple}s + 1)Z_{IP}}{Z_{IP}C_{decouple}s + 1} \quad \text{equation [22]}$$

where $R_{zero}$ may represent the impedance of the resistor $R_{zero}$ 237. The internal supply voltage, $V_{internal}$, may therefore be represented as:

$$V_{internal} \cong g_{m228} \frac{\left( \frac{A_{OTA} V_{\text{Input\_reference}} - V_{supply}}{1 + g_{m228}A_{OTA}(s)} \right)}{\frac{R_{zero}(Z_{IP}C_{decouple}s + 1) + Z_{IP}}{Z_{IP}C_{decouple}s + 1}} \quad \text{equation [23]}$$

Based on equation[23], a transfer function may be defined that represents the relationship between the internal supply voltage, $V_{internal}$, and the global supply voltage, $V_{supply}$:

$$\frac{V_{internal}}{V_{supply}} \cong - \frac{\left( \frac{g_{m228}}{1 + g_{m228}A_{OTA}(s)} \right) (R_{zero}(Z_{IP}C_{decouple}s + 1) + Z_{IP})/(Z_{IP}C_{decouple}s + 1)}{\frac{R_{zero}(Z_{IP}C_{decouple}s + 1) + Z_{IP}}{Z_{IP}C_{decouple}s + 1}} \quad \text{equation [24]}$$

The equation[24] may express the degree of coupling between the internal supply voltage $V_{internal}$, and the global supply voltage, $V_{supply}$. The equation[24] may express the amount of change in $V_{internal}$, that may be induced by a given change in $V_{supply}$. As shown in equation[24], the amount of induced change in $V_{internal}$ from a change in $V_{supply}$ may vary as a function of frequency, s.

The resistor $R_{zero}$ may increase the bandwidth of the linear regulator to result in a high PSRR over a wider bandwidth. If the impedance of the IP core, 240, $Z_{IP}$, is large, equation[23] may be represented:

$$V_{internal} \cong g_{m228} \frac{\left( \frac{A_{OTA} V_{\text{Input\_reference}} - V_{supply}}{1 + g_{m228}A_{OTA}(s)} \right)(R_{zero}C_{decouple}s + 1)/C_{decouple}s}{\frac{R_{zero}C_{decouple}s}{C_{decouple}s}} \quad \text{equation [25]}$$

and equation[24], for the transfer function, may be represented:

$$\frac{V_{internal}}{V_{supply}} \cong - \frac{\left( \frac{g_{m228}}{1 + g_{m228}A_{OTA}(s)} \right)(R_{zero}C_{decouple}s + 1)/C_{decouple}s}{\frac{R_{zero}C_{decouple}s + 1}{C_{decouple}s}} \quad \text{equation [26]}$$

In equations [25] and [26], the resistor $R_{zero}$ may create a low pass filter with the decoupling capacitor $C_{decouple}$ 238 that filters out any unwanted signals, such as, for example, noise or jitter, that may be passed from the global supply voltage $V_{supply}$ to the internal supply voltage $V_{internal}$ resulting from a lower value of open loop gain $A_{OTA}$ that may occur at high frequencies. Furthermore, the isolation resistor, $R_{zero}$ may create a zero in the transfer function, as seen in equation[26] that may assist in maintaining frequency stabilization of the loop that comprises the IP core 240, the OTA 226, the output transistor 228, the isolation resistor $R_{zero}$ 337, and the decoupling capacitor, $C_{decouple}$ 238. As a result, $C_{decouple}$ 238 and the transconductance of the transistor 228, $g_{m228}$, may not represent the dominant pole. Thus, the OTA 226 may be compensated with a higher frequency pole. The higher frequency pole in the OTA 226 may allow the OTA 226 to maintain a large value of the open loop gain, $A_{OTA}(s)$, at higher frequency due to the 3 dB bandwidth pole at the frequency, so, being substituted for a pole at a higher frequency, $s_1$. Consequently, the internal supply voltage, $V_{internal}$, may be held at a voltage level that is approximately equal to the voltage level of the internal reference voltage, Internal_$V_{reference}$ over a wider range of frequencies, or bandwidth.

Figure 4:
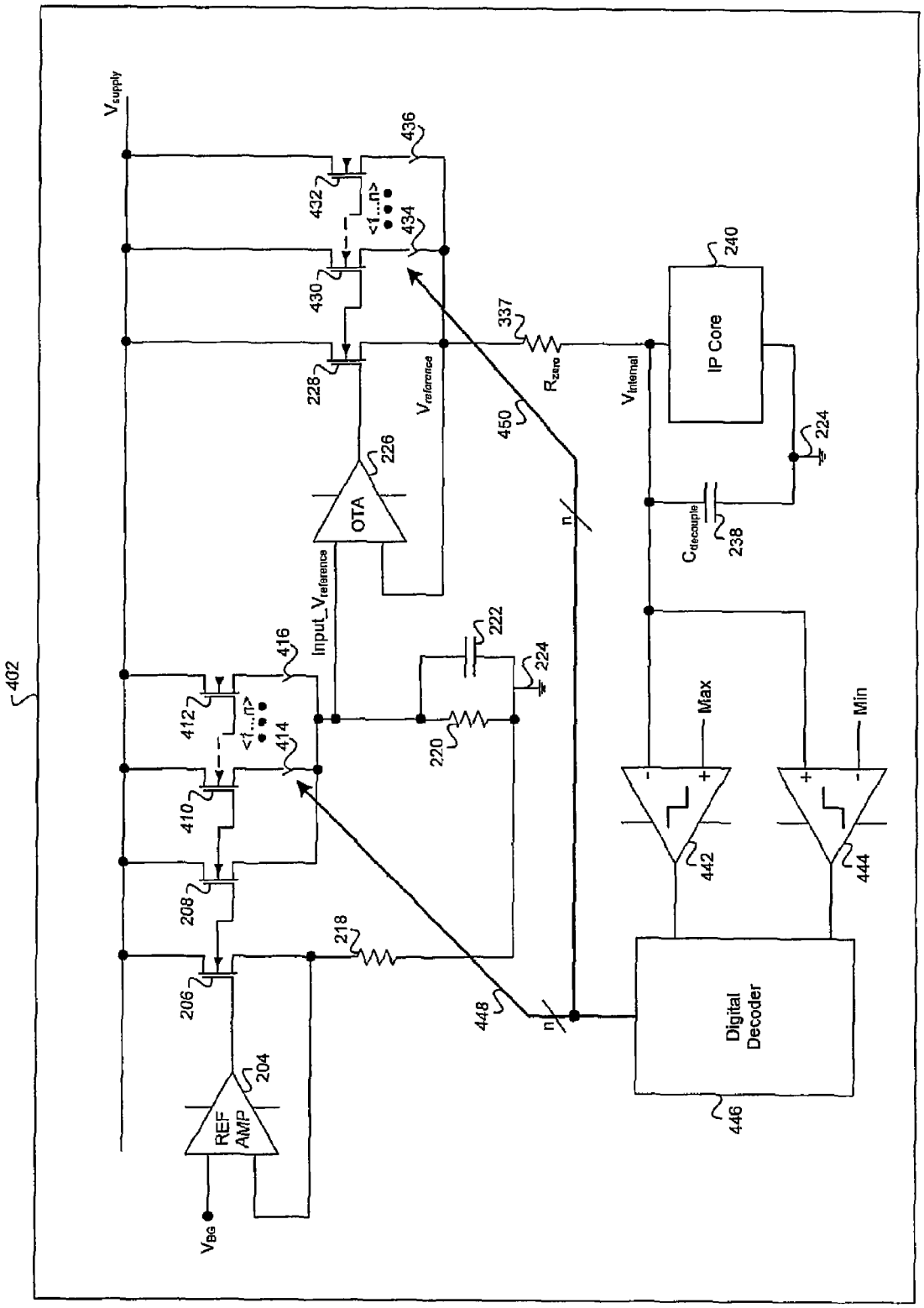
FIG. 4 is a block diagram of an exemplary system for a linear regulator with high bandwidth, power supply rejection ratio and a wide range of output current in accordance with an embodiment of the invention.

FIG. 4 is a block diagram of an exemplary system for a linear regulator with high bandwidth, power supply rejection ratio and a wide range of output current in accordance with an embodiment of the invention. With reference to FIG. 4, there is shown an IC 402. The IC 402 may comprise a reference amplifier 204, a plurality of reference transistor devices 206, 208, 410 . . . 412, a plurality of resistors 218 and 220, a capacitor 222, an on-chip decoupling capacitor $C_{decouple}$ 238, an operational transconductance amplifier (OTA) 226, a plurality of output transistor devices 228, 430 . . . 432, an isolation resister, $R_{zero}$ 337, an IP core 240, a plurality of switches 414 . . . 416, 434 . . . 436, amplifiers 442 and 444, a digital decoder 446, and a ground reference 224. Also shown in FIG. 4 are voltages $V_{supply}$, Input_$V_{reference}$, $V_{reference}$, $V_{internal}$, Min, and Max. The OTA 226, switches 434 . . . 436, and output transistors 228, 430 . . . 432 may comprise output stage circuitry. The IC 402 may further extend output current range of the regulator over which the internal supply voltage $V_{internal}$ may be tightly regulated with a high PSRR and over a wide bandwidth, in accordance with an embodiment of the invention.

The isolation resistor $R_{zero}$ may increase the bandwidth of the PSRR, however, it may also introduce an undesirable voltage drop, $V_R$, across the $R_{zero}$ 337. The current through $R_{zero}$ may depend on the current consumption of the IP core 240. The current consumption which may vary for different types of IP cores and the current consumption may also vary over time for a particular IP core, such as, for example 240. The internal supply voltage $V_{internal}$ may vary linearly based on the current through the isolation resistor, $R_{zero}$ 337. In various embodiments of the invention, regulation of the internal supply voltage, $V_{internal}$, may comprise a method to tightly control the value of $V_{internal}$ within a range of voltage values between Max and Min such that:

$$\text{Min} < V_{internal} < \text{Max} \qquad \text{equation[27]}$$

The operational amplifiers 442 and 444 may compare inputs Max (maximum) and Min (minimum) to the internal supply voltage $V_{internal}$ and produce an output signal, $\text{Diff}_{442}$ and $\text{Diff}_{444}$ respectively:

$$\text{Diff}_{442} = C(\text{Max} - V_{internal}), \qquad \text{equation[28]}$$

$$\text{Diff}_{444} = C(V_{internal} - \text{Min}), \qquad \text{equation[29]}$$

where the variable Max may refer to a maximum voltage value in a range, Min may refer to a minimum voltage in a range and C may represent a gain constant. Due to the large value of the gain constant, C, $\text{Diff}_{442}$ may attain a logical value of 1, when $V_{internal} <$ Max and may attain a logical value of 0 when $V_{internal} >$ Max. Similarly, $\text{Diff}_{444}$ may attain a logical value of 1 when $V_{internal} >$ Min and may attain a logical value of 0 when $V_{internal} <$ Min. If the condition shown in equation[27] is not met, the digital decoder 446 may be activated by the operational amplifier 442 if $V_{internal} >$ MAX, or by the operational amplifier 444 if $V_{internal} <$ MIN. Based on the outputs from the operational amplifiers 442 and 444, the plurality of transistors 410 . . . 412 may be turned ON or turned OFF via the plurality of switches 414 . . . 416. The plurality of switches 414 . . . 416 may be turned ON or turned OFF under the control of the digital decoder 446, via the digital word 448. The control of the plurality of switches 414 . . . 416 may adjust the voltage level of input reference voltage Input_$V_{reference}$. The adjustment of Input_$V_{reference}$ may induce an adjustment in the voltage level of the reference voltage, $V_{reference}$. The adjustment of $V_{reference}$ may induce an adjustment in the internal supply voltage $V_{internal}$ such that the condition of equation [27] may be satisfied.

To keep the current source transistor 228 in saturation for wide range of output current levels the plurality of output transistors 430 . . . 432 may be added in parallel to the transistor 228. The plurality of output transistors 430 . . . 432 may be turned ON or turned OFF via the plurality of switches 434 . . . 436. The plurality of switches 434 . . . 436 may be controlled by the digital word 450 from the digital decoder 446. This may insure proper biasing and operating conditions for the plurality of current source transistors 228, and 430 . . . 432 over the wide range of output current values.

For a value of the internal supply voltage $V_{internal}$ that is greater than the minimum (Min) but less than the maximum (Max), at least a portion of the plurality of reference transistors 410 . . . 412 may be turned on, and at least a portion the plurality of output transistors 430 . . . 432 may be turned on. For a value of the internal supply voltage $V_{internal}$ which is greater than the maximum (Max), the digital decoder 446 may turn OFF a portion of the plurality of reference transistors 410 . . . 412, and/or the digital decoder 446 may turn OFF a portion of the plurality of output transistors 430 . . . 432. For a value of the internal supply voltage $V_{internal}$ that is less than the minimum (Min), the digital decoder 446 may turn ON at least a portion of the plurality of reference transistors 410 . . . 412, and/or the digital decoder 446 may turn ON at least a portion of the plurality of output transistors 430 . . . 432.

$I_{RA}$ may be a static current with a time varying component that may have a similar transfer function to that of the drain current, $i_{dr208}$ for transistor 208 as described in equations [10], and [11]. The steady state, or DC, value of the input reference voltage, Input_$V_{reference}$, may depend on the value of the current $I_{RA}$. For example, the turning ON/OFF of the plurality of transistors 410 . . . 412 may modify the amount of drain current, $i_{dr208}$, at transistor 208, which may result in a change in steady state operating conditions, and thus, the DC value of the input reference voltage Input_$V_{reference}$. The change, however, may not affect the small signal transfer function analysis described in equation [11] if the plurality of transistors comprising transistor 208, and the plurality of transistors 410 . . . 412 are in operating saturation for a range DC values of the input reference voltage Input_$V_{reference}$.

A transfer function relationship may also express the amount of change in the internal supply voltage, $V_{internal}$, that may be induced by current injection from a current source, $I_{oA}$, which is injected at a point that is coupled to the drain of transistor 228:

$$\frac{V_{internal}}{I_{oA}} = \frac{R_{zero}(Z_{IP}C_{decouple}s + 1) + Z_{IP}}{Z_{IP}C_{decouple}s + 1} \qquad \text{equation [30]}$$

where examples of current sources of $I_{oA}$ may comprise the plurality of output transistors 430 . . . 432.

The equation[30] may express the amount of change in $V_{internal}$ that may be induced by a given change in the injected supply current $I_{oA}$. As shown in equation[30], the amount of induced change in $V_{internal}$ from a change in $I_{oA}$ may vary as a function of frequency, s. The control of the plurality of switches 434 . . . 436, may result in a change in current from the plurality of output transistors 430 . . . 432 that induces a corresponding change in the internal supply voltage $V_{internal}$ that may offset a change in $V_{internal}$ that may result from noise or jitter in the global supply voltage, $V_{supply}$, as indicated in the transfer function in equation[20].

Figure 5:
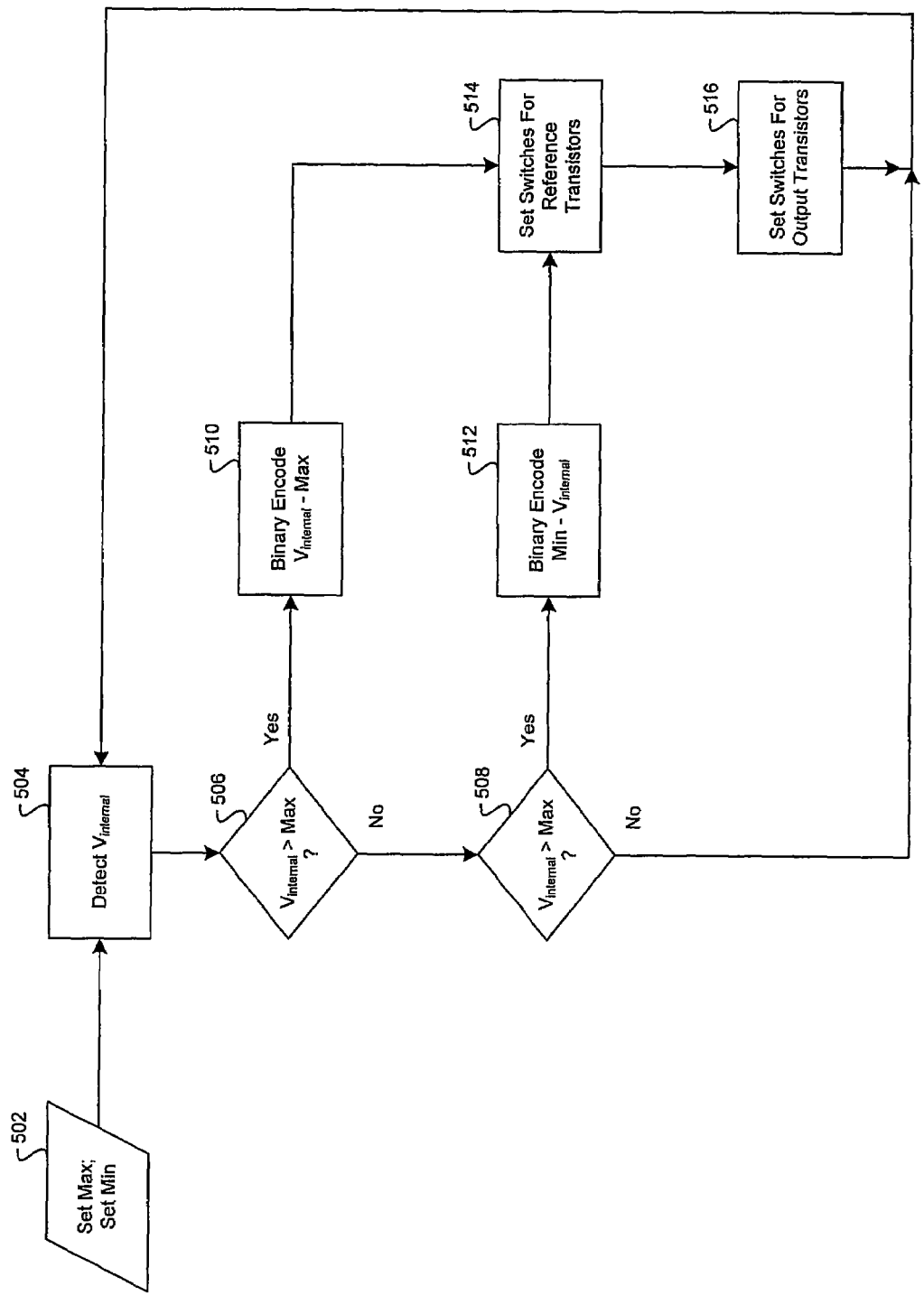
FIG. 5 is a flow chart illustrating exemplary steps for a line regulator with high bandwidth and high PSRR over a wide range of output current, in accordance with an embodiment of the invention.

FIG. 5 is a flow chart illustrating exemplary steps for a line regulator with high bandwidth and high PSRR over a wide range of output current, in accordance with an embodiment of the invention. With reference to FIG. 5, in step 502 values for the maximum (Max) internal voltage supply level, and minimum (Min) internal voltage supply level may be set. In step 504, the voltage level of the internal supply voltage, $V_{internal}$, may be detected. Step 506 may determine whether the voltage level of the internal supply voltage, $V_{internal}$, is greater than the maximum value, Max. Step 510 may binary encode the voltage level difference between $V_{internal}$ and Max if the voltage level of the internal supply voltage, $V_{internal}$, is greater than the maximum value, Max. Step 514 may set switches among the plurality of switches 414 . . . 416 which may be coupled to the plurality of reference transistors 410 . . . 412. Step 516 may set switches among the plurality of switches 434 . . . 436 which may be coupled to the plurality of reference transistors 430 . . . 432. Step 508 may determine whether the voltage level of the internal supply voltage, $V_{internal}$, is less than the minimum value, Min, if step 508 did not determine that the voltage level of the internal supply voltage, $V_{internal}$, was greater than the maximum value, Max. Step 512 may binary encode the voltage level difference between Min, and $V_{internal}$ if the voltage level of the internal supply voltage, $V_{internal}$, is less than the minimum value, Min.

By utilizing an on-chip resistor $R_{zero}$ 337, decoupling capacitor $C_{decouple}$ 238, and output stage circuitry that may control the value of the reference voltage $V_{reference}$, by utilizing a plurality of reference transistors that may control the value of the input reference voltage Input_$V_{reference}$, and plurality of current source transistors to control the amount of current supplied from a current source, the value of the internal voltage $V_{internal}$ may be tightly regulated over a wide range of output current, as measured through the isolation resistor $R_{zero}$ 337, with high PSRR over a wide bandwidth, in accordance with an embodiment of the invention.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for isolating voltages in a circuit, the method comprising:
    concurrently comparing an internal voltage to a plurality of voltage levels comprising a maximum voltage and a minimum voltage;
    controlling at least one plurality of transistor devices based on said comparing;
    determining said internal voltage based on a reference voltage; and
    modifying said reference voltage based on controlling a portion of said at least one plurality of transistor devices.

2. The method according to claim 1, comprising generating said reference voltage is based on a supply voltage.

3. The method according to claim 1, wherein said portion of said at least one plurality of transistor devices is a plurality of output transistor devices.

4. The method according to claim 3, comprising reducing changes in said internal voltage in response to changes in a supply voltage based on controlling said plurality of output transistor devices.

5. The method according to claim 4, wherein said controlling said plurality of output transistor devices is based on a difference between said maximum voltage and said internal voltage and/or a difference between said minimum voltage and said internal voltage.

6. The method according to claim 1, comprising generating said reference voltage based on an input reference voltage.

7. The method according to claim 6, comprising decoupling at least a direct current (DC) portion of said input reference voltage from a ground reference.

8. The method according to claim 6, comprising modifying said input reference voltage based on controlling a subsequent portion of said at least one plurality of transistor devices.

9. The method according to claim 8, wherein said subsequent portion of said at least one plurality of transistor devices is a plurality of reference transistor devices.

10. The method according to claim 9, comprising controlling said plurality of reference transistor devices based on a difference between said maximum voltage and said internal voltage and/or a difference between said minimum voltage and said internal voltage.

11. The method according to claim 1, comprising decoupling at least a DC portion of said internal voltage from a ground reference.

12. A system for isolating voltages in a circuit, the system comprising:
    one or more circuits that are operable to concurrently compare an internal voltage to a plurality of voltage levels comprising a maximum voltage and a minimum voltage;
    said one or more circuits are operable to control at least one plurality of transistor devices based on said comparison;
    said one or more circuits are operable to determine said internal voltage based on a reference voltage; and
    said one or more circuits are operable to modifying said reference voltage based on control of a portion of said at least one plurality of transistor devices.

13. The system according to claim 12, wherein said one or more circuits are operable to generate said reference voltage is based on a supply voltage.

14. The system according to claim 12, wherein said portion of said at least one plurality of transistor devices is a plurality of output transistor devices.

15. The system according to claim 14, wherein said one or more circuits are operable to reduce changes in said internal voltage in response to changes in a supply voltage based on control of said plurality of output transistor devices.

16. The system according to claim 15, wherein said control of said plurality of output transistor devices is based on a difference between said maximum voltage and said internal voltage and/or a difference between said minimum voltage and said internal voltage.

17. The system according to claim 12, wherein said one or more circuits are operable to generate said reference voltage based on an input reference voltage.

18. The system according to claim 17, wherein said one or more circuits are operable to decouple at least a direct current (DC) portion of said input reference voltage from a ground reference.

19. The system according to claim 17, wherein said one or more circuits are operable to modify said input reference voltage based on control of a subsequent portion of said at least one plurality of transistor devices.

20. The system according to claim 19, wherein said subsequent portion of said at least one plurality of transistor devices is said plurality of reference transistor devices.

21. The system according to claim 20, wherein said one or more circuits are operable to control said plurality of reference transistor devices based on a difference between said maximum voltage and said internal voltage and/or a difference between said minimum voltage and said internal voltage.

22. The system according to claim 12, wherein said one or more circuits are operable to decouple at least a DC portion of said internal voltage from a ground reference.

23. The system according to claim 12, wherein said one or more circuits comprise at least one operational amplifier, a digital decoder, a capacitor, said plurality of output transistor devices and a plurality of reference transistor devices.

* * * * *